United States Patent [19]

Fukae

[11] Patent Number: 4,721,977

[45] Date of Patent: Jan. 26, 1988

[54] ELECTROGRAPHIC PRINTER WITH ABUTTING CHIPS EACH HAVING AN ARRAY OF CHARGE-DISCHARGING ELEMENTS

[75] Inventor: Kensuke Fukae, Monsey, N.Y.

[73] Assignee: Kentek Information Systems, Inc., Allendale, N.J.

[21] Appl. No.: 674,592

[22] Filed: Nov. 26, 1984

[51] Int. Cl.[4] ........................ G03G 15/04; H01L 33/00

[52] U.S. Cl. ........................................ 355/3 R; 357/17

[58] Field of Search ...................... 355/1, 3 R; 357/17; 362/800; 29/583

[56] References Cited

U.S. PATENT DOCUMENTS

| | | | |
|---|---|---|---|
| 2,886,748 | 5/1959 | Barton | 29/583 X |
| 3,615,047 | 10/1971 | Feldman et al. | 225/1 |
| 4,217,689 | 8/1980 | Fujii et al. | 29/583 |
| 4,435,064 | 3/1984 | Tsukada et al. | 355/1 |
| 4,447,126 | 5/1984 | Heidrich et al. | 355/1 X |
| 4,451,972 | 6/1984 | Batinovich | 29/583 |
| 4,549,784 | 10/1985 | Inokuchi | 355/1 X |
| 4,553,148 | 11/1985 | Behrens et al. | 355/3 R X |

FOREIGN PATENT DOCUMENTS

| | | |
|---|---|---|
| 604494 | 7/1948 | United Kingdom . |
| 473683 | 6/1975 | U.S.S.R. . |

OTHER PUBLICATIONS

IBM Technical Disclosure Bulletin, vol. 21, No. 8, Jan. 1979.

*Primary Examiner*—Fred L. Braun
*Attorney, Agent, or Firm*—Marmorek, Guttman & Rubenstein

[57] ABSTRACT

A multiple chip Led linear array including 2048 elements is achieved by a unique wafer dicing technique which allows LEDs in abutting chips to be separated by the same distance as adjacent elements on a single chip. The linear array is employed in photocopy apparatus to discharge a linear segment of a photosensitive drum.

6 Claims, 9 Drawing Figures

ELECTROGRAPHIC PRINTER WITH ABUTTING CHIPS EACH HAVING AN ARRAY OF CHARGE-DISCHARGING ELEMENTS

FIELD OF INVENTION

This invention relates to semiconductor devices and more particularly to such devices operable to emit light.

BACKGROUND OF THE INVENTION

Semiconductor devices operative to emit light when activated are exemplified by light emitting diodes (LEDs). Such devices are used to form an array of devices or elements each of which produces a light output (or not) depending upon whether it is activated or not. It is known to use a linear array of LED elements to expose consecutive linear segments of an electrostatic drum commonly used in photocopiers. The LEDs discharge the consecutive linear segments of the drum as the drum rotates.

One problem with such an arrangement is that a linear segment across the drum requires 2048 LED elements and semiconductor chips have not been made in which such a number of LEDs can be formed in an uninterrupted line. Such a problem is not easily corrected. U.S. Pat. No. 4,435,064, for an invention of T. Tsukada et al., describes various arrangements of LEDs which produce the effect of an uninterrupted linear array of LEDs. In one arrangement, two lines of spaced apart LED chips are formed, and a plurality of chips is used in each line. The chips are arranged so that the LEDs appear in spaced apart groups where the groups in the second row align with the spaces in the first. The two lines of LEDs are aligned across the drum and when timed properly produce a continuous linear effect in discharging the drum. But this technique requires careful alignmentof the chips and relatively complicated and thus expensive control circuitry. Alternatively, LEDs may be arranged in groups where each group is aligned along an axis at 45° with respect to the direction of rotation of the drum. The end diodes of each group are aligned adjacent to a line parallel to the direction of rotation. Again, when properly activated, the effect of a straight linear array across the entire drum is achieved.

Relatively short linear arrays of LEDs cannot, at present, be abutted to form a longer array because when the chips are cut, the spacing between the diode closest to the edge of the chip and the edge of the chip is larger than the spacing between adjacent LEDs. The main reason for this spacing problem is that chips are cut by a dicing wheel which has a bevel to its cutting edge. That bevel dictates a setback from the edge of the chips to the closest diode. Considerations as to damage caused by the dicing wheel dictate a further setback. Of course, when two identical such chips are abutted, the total spacing between the two diodes closest to the adjacent edges of these chips is twice the setback of each diode from the edge thereof; as a result there may be objectionable spacings in a linear array formed by abutting a number of chips having small spacings between diodes for high density applications. Although in low density applications abutted conventional arrays may be usable, the arrangement poses problems for printing heads where close spacings are required.

BRIEF DESCRIPTION OF THE INVENTION

The present invention is based on the realization that LED chips can be diced so that two chips can be abutted in a manner such that nearest LED neighbors on adjacent chips are separated by a distance equal to that separating very closely spaced nearest neighbors on a single chip. The close separation between closest neighbors on different chips is realized by using two opposing dicing wheels to cut a semiconductor wafer into chips from both surfaces simultaneously. It has been found that the linear distance of edge bevel dictated by the cutting surface is reduced by a factor of 2 and the damage produced by the cut is contained to such an extent that equal distances between LEDs can be maintained even in linear arrays of 2048 required for discharging a complete linear array of a photosensitive drum. Accordingly, a relatively inexpensive and easily controllable photocopier arrangement is achieved.

DETAILED DESCRIPTION

Figure 1:
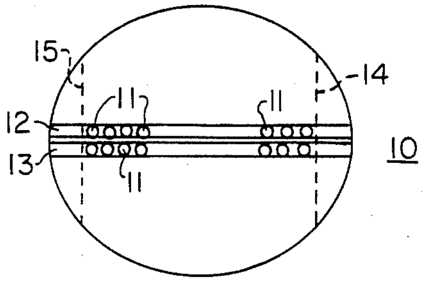
FIG. 1 is an enlarged top view of a semiconductor wafer showing the positions of adjacent rows of LEDs.
Figure 2:
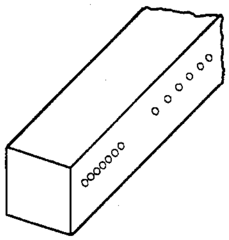
FIG. 2 shows an LED array segment separated from the wafer of FIG. 1.

FIG. 1 shows a semiconductor wafer 10 in which LEDs 11 are defined in adjacent rows 12, 13, and so on. The LEDs are produced by well understood photolithographic techniques. The rows are separated from one another by means discribed for example in U.S. Pat. No. 3,615,047 for an invention of D. Feldman et al. The ends of the rows are cut along broken line 14 and 15 to produce an edge perpendicular to the edge defined by separating the rows of LEDs.

The number of LEDs in a row such as 12 is limited. A semiconductor wafer, for example, is typically three inches in diameter, although experimentally wafers have been made having a diameter as much as six inches. A copier, on the other hand, requires at least eight and one half inches of LEDs to operate effectively to copy paper having a width of eight and one half inches. Not only is a three-inch row of LEDs too short but, also the cuts along broken lines 14 and 15 further reduce the length of the row. Clearly, a linear array of 2048 LEDs can be achieved presently only by abutting several smaller rows of LEDs or by some artifact as described above. The invention is based on the recognition that wafer 10 can be cut along lines 14 and 15 so that rows 12 and 13 can be abutted to form a continuous linear array of LEDs longer than can be achieved from a single wafer. In fact, several of such rows can be abutted to provide the accepted 2048 element configuration without staggering or angle-aligning a plurality of segments as described hereinbefore.

Figure 3:
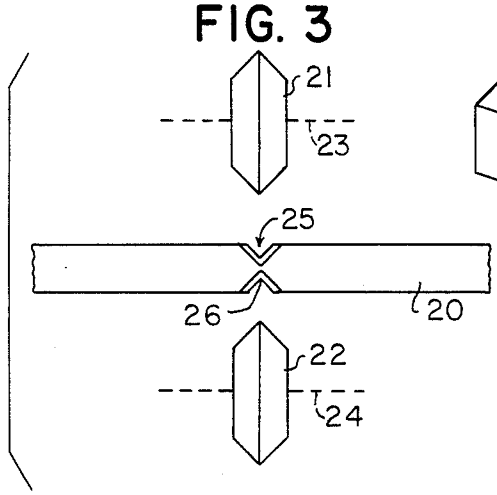
FIG. 3 shows a cross section of a portion of the wafer of FIG. 1 along with opposing dicing wheels for cutting the wafer.

The dicing of wafer 10 along broken line 14 or 15 in FIG. 1 is depicted in FIG. 3. The figure shows portion 20 of wafer 10 positioned so that dicing wheels 21 and 22 oppose one another. The wheels are rotated about axes represented by broken lines 23 and 24 and pressed into contact with portion 20 in a manner to make v-shaped cuts 25 and 26 respectively. Opposing dicing wheels are well known. One description of the use of such opposing wheels for cutting glass panels is disclosed in the IBM Technical Disclosure Bulletin, Vol 21, No 8, January 1979.

Figure 4:
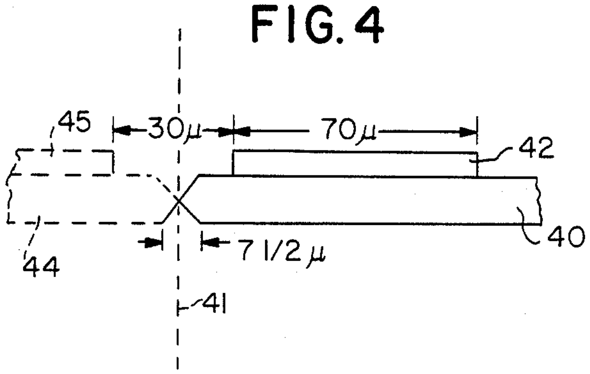

Each dicing wheel has a diameter of six inches (average) and is levelled to produce a $7\frac{1}{2}$ micron cut from each face of the wafer as shown in FIG. 4. FIG. 4 shows wafer portion 40 cut along axis 41; as shown, LED 42 is adjacent an edge having a two-sided bevel made by dicing the wafer by opposing wheels as shown in FIG. 3. The separation between LEDs in two abutted wafers is depicted in FIG. 4 by showing wafer portion 40 abutted against imaginery wafer portion 44 of an adjacent wafer. LED 45 is shown adjacent the cut at 41. The damage due to dicing by opposing wheels is limited to less than about ten microns on each side of the cut, so that LEDs 42 and 45 may be placed thirty microns apart.

Figure 5:
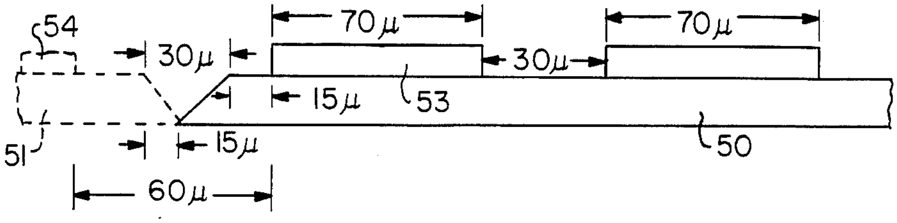
FIG. 5 PRIOR ART
FIGS. 4 and 5 show cross section views of a semiconductor wafer cut by a pair of cutting wheels and by prior art techniques respectively.

FIG. 5 shows a prior art arrangement of a wafer portion 50 similarly positioned with respect to an imaginery second wafer portion 51. The wafer portions again are shown in positions dictated as if the two portions 50 and 51 were cut apart by a single dicing wheel from a single wafer. The cut is thirty microns, so that adjacent LEDs 53 and 54, on opposite sides of the cut, may be positioned no closer than at least sixty microns.

Figure 6:
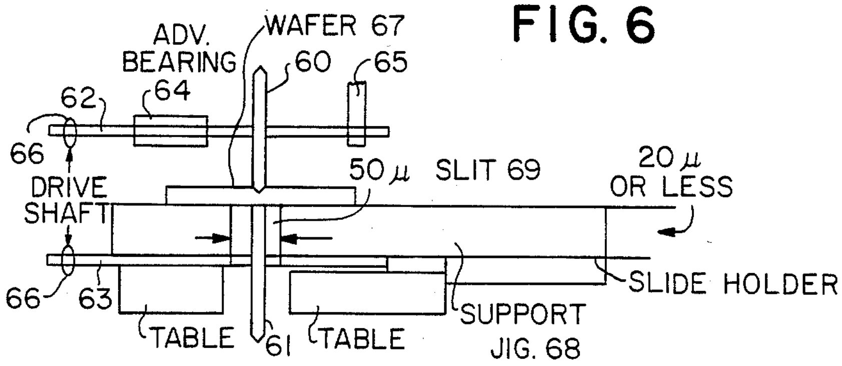
FIG. 6 shows a schematic view of cutting apparatus in accordance with this invention.

FIG. 6 shows apparatus for dicing a semiconductor wafer in the manner discussed in connection with FIG. 4. Two dicing wheels 60 and 61 are disposed on axles 62 and 63 respectively, axle 61 being supported by AOU bearing 64 and arm 65. The axles are driven by a common drive shaft indicated at 66. A wafer to be diced is shown at 67 in FIGS. 6 and 7. The wafers are secured to a support jig 68 also shown in FIGS. 6 and 7. The support jig has a 50 micron slit 69 in it. Wafers have been diced using a 20 micron cutting wheel in accordance with the present invention in a manner suitable for abuttment as discussed above.

Figure 7:
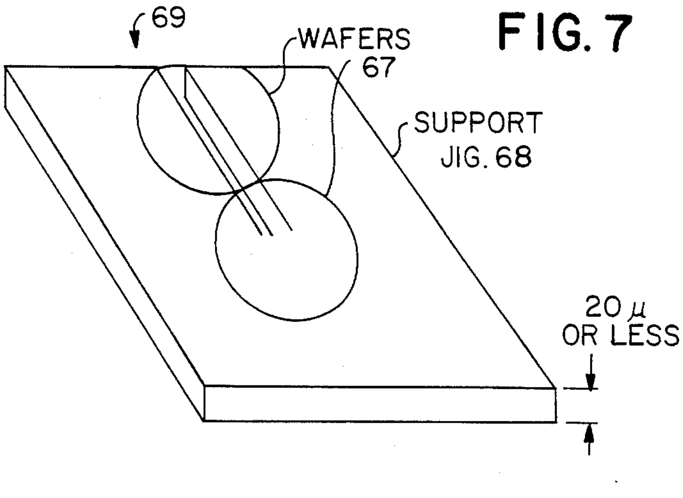
FIG. 7 shows an enlarged schematic top view of a GaAs wafer including LED arrays abutted in accordance with this invention.
Figure 8:
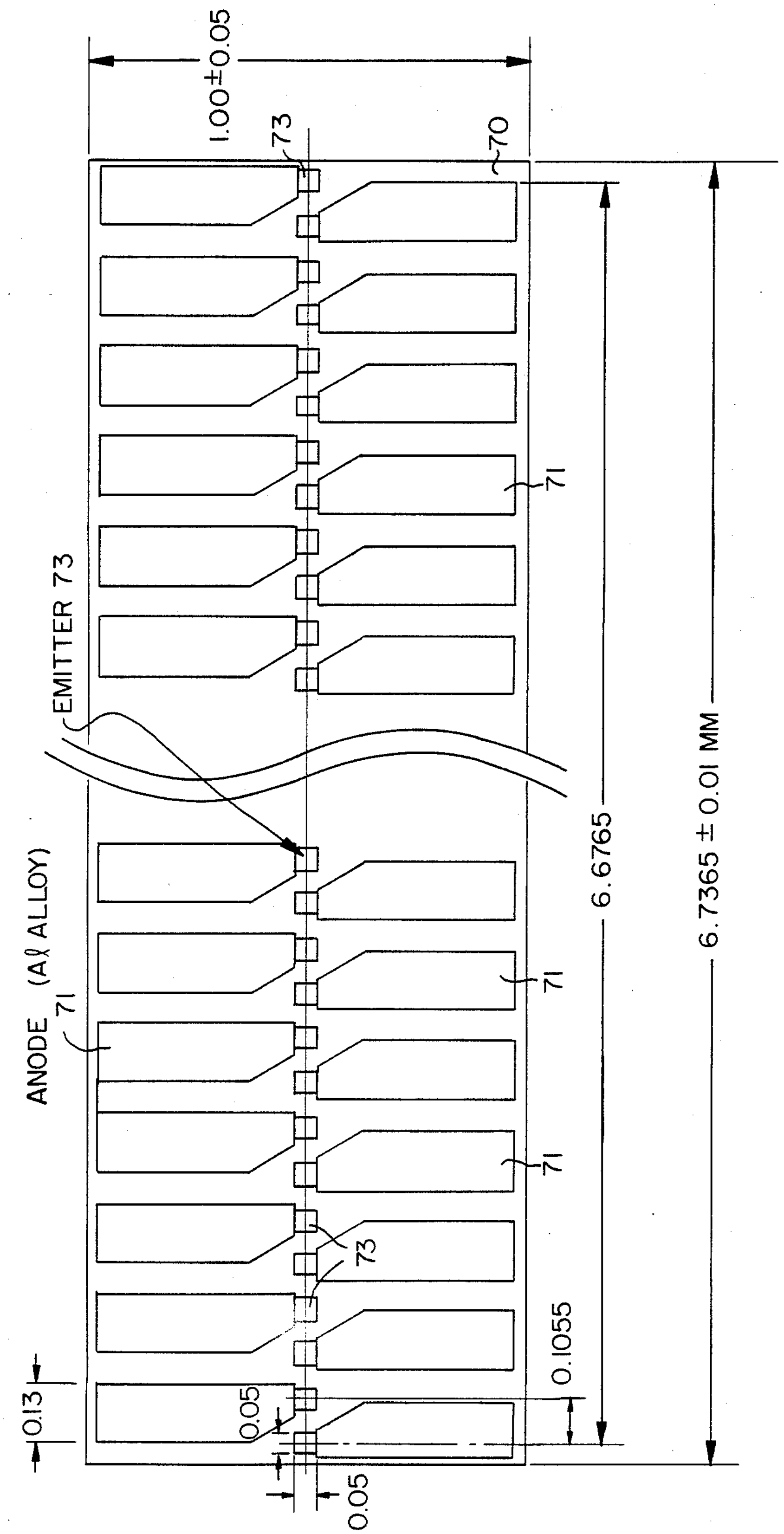
FIG. 8 shows an enlarged top view of a position of an array of LEDs made with the apparatus of FIGS. 6 and 7.

FIG. 8 shows an enlarged top view of a portion of an array of LEDs made with the apparatus of FIGS. 6 and 7 as shown in FIG. 4. The array has 2048 Ielements defined in 32 chips. The array lengh is 216 mm. The resolution is 9.45 dots/mm (240/inch). A gallium arsenide (GaAs) chip 70 with a phosphorus diffusion is used. Anodes 71 are defined by patterns of aluminum alloy as shown. Emitters (LEDs) 73 are defined as shown. The dimensions as shown in the figure are in millimeters. Each chip has sixty four LEDs defined on it and adjacent chips are abutted as shown in FIG. 4.

Figure 9:
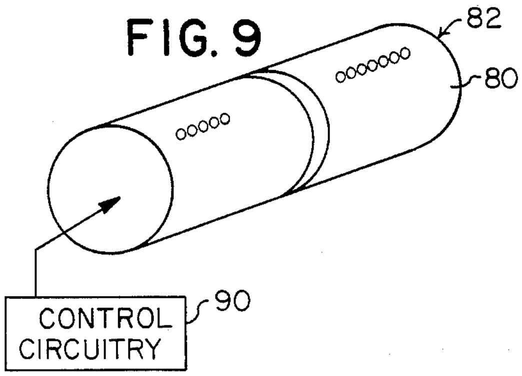
FIG. 9 shows a projection view of a photosensitive drum along with the positions of a linear LED array in phantom.

The thirty two abutted chips are organized into an LED subassembly and juxtaposed with a light-beam transmission and convergence subassembly (not shown) for positioning with respect to photosensitive drum 80 of FIG. 9. The position of the subassemblies is represented by the line of circles at 82. The organization of the subassemblies with respect to drum 80 is consistent with the teachings of the above noted patent of Tsukada.

It is contemplated that charge coupled devices can be ganged in the same manner to provide a linear scanning with similar advatages.

The LEDs of a linear array in accordance with this invention are activated simultaneously and the drum is then rotated incrementally to a next position. The LEDs are again activated and the process repeated until the entire drum is exposed to produce thereon a latent image for transfer to paper in the familiar manner. Circuitry, the design of which is well-known in the art, for so activating the LEDs and for incrementing the drum is represented in FIG. 9 by block 90.

What is claimed is:

1. A linear array of semiconductor chips, each of said chips having defined thereon a linear array of semiconductor elements arranged along a common axis, each of said elements having a dimension X along said axis, said elements having a separation S along said axis between adjacent ones thereof, each of said chips having first and second end elements respectively adjacent first and second opposite edges thereof, said second element of one of said chips being spaced apart from said first end element of the next adjacent chip along said axis by said separation S, the edge of each chip in the array that is not at an end of the array having a two-sided bevel.

2. An array according to claim 1, wherein S is less than 50 microns.

3. An array according to claim 2, wherein S is approximately 30 microns.

4. An array of semiconductor chips according to claim 2, wherein each of said chips comprises gallium arsenide.

5. An array of semiconductor chips according to claim 1, wherein said elements are LEDs.

6. An assembly for a photocopier, the assembly comprising:

a photosensitive drum and, disposed proximately thereto, an array of semiconductor chips according to claim 5.

* * * * *